(12) United States Patent
Feucht et al.

(10) Patent No.: US 11,124,138 B2
(45) Date of Patent: Sep. 21, 2021

(54) DEVICE FOR SUPPLYING POWER TO A CONTROL UNIT AND METHOD FOR MONITORING A POWER SUPPLY

(71) Applicant: KNORR-BREMSE SYSTEME FUER NUTZFAHRZEUGE GMBH, Munich (DE)

(72) Inventors: Thomas Feucht, Wimsheim (DE); Wolfgang Gscheidle, Oberstenfeld (DE)

(73) Assignee: KNORR-BREMSE SYSTEME FUER NUTZFAHRZEUGE GMBH, Munich (DE)

( * ) Notice: Subject to any disclaimer, the term of this patent is extended or adjusted under 35 U.S.C. 154(b) by 58 days.

(21) Appl. No.: 16/605,457

(22) PCT Filed: Apr. 10, 2018

(86) PCT No.: PCT/EP2018/059197
§ 371 (c)(1),
(2) Date: Oct. 15, 2019

(87) PCT Pub. No.: WO2018/192806
PCT Pub. Date: Oct. 25, 2018

(65) Prior Publication Data
US 2021/0122311 A1 Apr. 29, 2021

(30) Foreign Application Priority Data
Apr. 18, 2017 (DE) .......................... 102017108207.7

(51) Int. Cl.
*B60R 16/03* (2006.01)
*G01R 31/00* (2006.01)
(Continued)

(52) U.S. Cl.
CPC ................ *B60R 16/03* (2013.01); *B60L 1/00* (2013.01); *G01R 31/006* (2013.01); *G01R 31/40* (2013.01);
(Continued)

(58) Field of Classification Search
CPC ...... G01R 31/50; G01R 31/52; G01R 31/006; G01R 31/55; H02J 1/108; H02J 7/0034;
(Continued)

(56) References Cited

U.S. PATENT DOCUMENTS 7,960,861 B2 * 6/2011 Gscheidle ............... H02J 1/108
307/52
8,829,718 B2 * 9/2014 Ido ............................ B60L 1/00
307/77
(Continued)

FOREIGN PATENT DOCUMENTS

CN 102377331 A 3/2012
CN 102590676 A 7/2012
(Continued)

OTHER PUBLICATIONS

International Search Report dated Jul. 26, 2018, of the corresponding International Application PCT/EP2018/059197 filed Apr. 10, 2018.

*Primary Examiner* — Ryan Johnson
(74) *Attorney, Agent, or Firm* — Norton Rose Fulbright US LLP; Gerard Messina (57) ABSTRACT

A device and related method for supplying power to a vehicle-control-unit, including: a first-connection (FC) for a first power-supply-path (PSP), a second-connection (SC) for a second PSP and a neutral-point for connecting the first- and second-PSPs; a first-switch having a first-contact connected to the FC and a second-contact connected to the neutral-point, and a second-switch having a first-contact
(Continued)

connected to the SC and a second-contact connected to the neutral-point; first and second-measuring-contacts for capturing first- and second-measured-values representing voltage-potentials of the first-PSP and the second-PSP; a control-device to keep one of the switches open and the other of the switches closed in response to a test-state; and a monitoring-device providing a monitoring-signal using the first and second measured-values for the test-state.

9 Claims, 3 Drawing Sheets

(51) Int. Cl.
*G01R 31/40* (2020.01)
*G05F 1/56* (2006.01)
*H02J 7/00* (2006.01)
*B60L 1/00* (2006.01)
*G01R 31/50* (2020.01)
*G01R 31/55* (2020.01)

(52) U.S. Cl.
CPC ............. *G01R 31/50* (2020.01); *G01R 31/55* (2020.01); *G05F 1/56* (2013.01); *H02J 7/0034* (2013.01)

(58) Field of Classification Search
CPC ........ H02J 7/0036; B60L 1/00; B60L 3/0069; B60R 16/03; G06F 1/26; G06F 1/30; H02H 11/002; H02H 11/003; H02H 11/001; H02H 11/005
See application file for complete search history.

(56) References Cited

U.S. PATENT DOCUMENTS

| | | | |
|---|---|---|---|
| 10,794,947 B2* | 10/2020 | Romero | G01R 31/50 |
| 2012/0161822 A1 | 6/2012 | Kanayama | |
| 2013/0278272 A1 | 10/2013 | Kaminski | |
| 2014/0084933 A1 | 3/2014 | Jang | |
| 2014/0159908 A1 | 6/2014 | Hong | |

FOREIGN PATENT DOCUMENTS

| | | |
|---|---|---|
| CN | 103376360 A | 10/2013 |
| CN | 105765683 A | 7/2016 |
| CN | 106068458 A | 11/2016 |
| DE | 102010033440 A | 2/2011 |

* cited by examiner

DEVICE FOR SUPPLYING POWER TO A CONTROL UNIT AND METHOD FOR MONITORING A POWER SUPPLY

FIELD OF THE INVENTION

The present invention relates to a device for supplying power to a control unit, to a control unit and to a method for monitoring a power supply.

BACKGROUND INFORMATION

Vehicles have control units which control safety-relevant functions, for example. Such control units require a reliable energy supply.

SUMMARY OF THE INVENTION

The present invention is based on the object of providing an improved device for supplying power to a control unit, an improved control unit and an improved method for monitoring a power supply.

According to the invention, this object may be achieved by a device for supplying power to a control unit, a control unit and a method for monitoring a power supply having the features of the main claims. Advantageous configurations and developments of the invention emerge from the subsequent subclaims.

A device for supplying power to a control unit for a vehicle has the following features:
a first connection for a first power supply path, a second connection for a second power supply path and a neutral point for connecting the first power supply path and the second power supply path;
a first switch having a first contact and a second contact, wherein the first contact is connected to the first connection and the second contact is connected to the neutral point, and a second switch having a first contact and a second contact, wherein the first contact is connected to the second connection and the second contact is connected to the neutral point;
a first measuring contact for capturing a first measured value representing a voltage potential of the first power supply path, and a second measuring contact for capturing a second measured value representing a voltage potential of the second power supply path;
a control device which is configured to keep one of the switches open and to keep the other switch closed in response to a test state of the device; and
a monitoring device which is configured to provide a monitoring signal using the first measured value and the second measured value if the device is in the test state.

The vehicle may be, for example, a vehicle for transporting persons or for transporting goods. For example, the vehicle may be a motor vehicle, an electric vehicle or a rail vehicle. The control unit may be an electrical device which can read in sensor signals via an interface, for example, and can use the sensor signals to output control signals for controlling a function of the vehicle via an interface. The two power supply paths may be redundant power supply paths. A supply voltage needed to operate the control unit may therefore be applied both to the first connection and to the second connection, or a supply current needed to operate the control unit can flow both via the first connection and via the second connection. In a closed state, a switch can allow a current flow between the contacts of the switch and, in an open state, can prevent a current flow. A measured value may be a voltage value. The voltage value may correspond to a voltage potential of the corresponding power supply path or may be dependent on the voltage potential. In the test state of the device, the power supply paths or at least one of the power supply paths can be checked, for example with respect to the presence of a fault caused by a short circuit, for example. In order to control the switches, the control device may be configured to make at least one control signal available to an interface to the switches. The monitoring device may be configured to evaluate the measured values in order to be able to detect the presence of a fault on at least one of the power supply paths. For this purpose, the measured values can be combined with one another. The monitoring signal may be configured to indicate a fault-free state or a fault on at least one of the power supply paths. The test state may be assumed by the device before activation or briefly during operation of the device, for example.

The device may have a diode (for example body diode of an FET) which is connected in parallel with the first switch between the first connection and the neutral point. Accordingly, the device may have a further diode (for example body diode of an FET) which is connected in parallel with the second switch between the second connection and the neutral point. The diodes enable a current flow between the neutral point and the respective connection even when the respective switch is open. The diode may be in the form of a discrete element or may be in the form of part of a circuit device comprising the diode and the respective switch.

The control device may be configured to close the switches in response to activation of the device. This minimizes the resistance between the neutral point and the connections. The control device may be configured to open the switches if the device is deactivated.

The control device may be configured to keep the first switch open and the second switch closed during a first phase of the test state. The control device may be configured to keep the first switch closed and the second switch open during a second phase of the test state. The first phase and the second phase may directly follow one another in any desired order in terms of time or may be spaced apart from one another in terms of time. The power supply paths can be alternately checked by alternately opening the first and second switches, while the respective other switch is closed.

The neutral point may represent a ground connection for an electrical circuit of the control unit. The power supply paths may therefore be ground power supply paths, so-called GND power supply paths or GND paths for short. Alternatively, the neutral point may be assigned to another voltage potential.

The monitoring device may be configured to compare the first measured value and the second measured value with one another in order to determine a discrepancy between the voltage potentials of the power supply paths. In this case, the monitoring signal may indicate the discrepancy. A comparison can be used to easily determine that one of the power supply paths does not have the intended voltage potential.

According to one embodiment, the first measuring contact can be arranged on a first connecting line between the first connection and the first contact of the first switch. Accordingly, the second measuring contact can be arranged on a second connecting line between the second connection and the first contact of the second switch. This enables a very simple implementation.

The device may have a third connection for providing a voltage potential. The device may also have a first spur line which comprises at least one first resistor and a first diode and connects the third connection to the first connection, and a second spur line which comprises at least one second resistor and a second diode and connects the third connection to the second connection. In this case, the first measuring contact can be arranged on the first spur line and the second measuring contact can be arranged on the second spur line or can be coupled to the corresponding spur line. The resistors make it possible to capture a voltage difference between the first connection and the third connection and between the second connection and the third connection. If the power supply paths do not have a fault, the voltage differences should be the same if the resistances and currents in the individual paths are the same.

A control unit for a vehicle may comprise an aforementioned device for supplying power to the control unit. In this case, the device may be integrated in the control unit, for example may be arranged inside a housing surrounding the control unit. The device can be advantageously used to detect and indicate when there is a fault in the energy supply for the control unit.

A method for monitoring a power supply for a control unit for a vehicle, wherein the power is supplied using a first connection for a first power supply path, a second connection for a second power supply path and a neutral point for connecting the first power supply path and the second power supply path, as well as a first switch having a first contact and a second contact, wherein the first contact is connected to the first connection and the second contact is connected to the neutral point, and a second switch having a first contact and a second contact, wherein the first contact is connected to the second connection and the second contact is connected to the neutral point, as well as a first measuring contact for capturing a first measured value representing a voltage potential of the first power supply path and a second measuring contact for capturing a second measured value representing a voltage potential of the second power supply path, comprises the following steps of:

making at least one control signal available to an interface to the switches in order to keep one of the switches open and the other of the switches closed; and reading in the first measured value and the second measured value; and providing a monitoring signal using the measured values.

Exemplary embodiments of the approach presented here are illustrated in the drawings and are explained in more detail in the following description.

In the following description of favorable exemplary embodiments of the present invention, identical or similar reference signs are used for the elements which are illustrated in the various figures and have a similar effect, in which case these elements are not described repeatedly.

DETAILED DESCRIPTION

Figure 1:
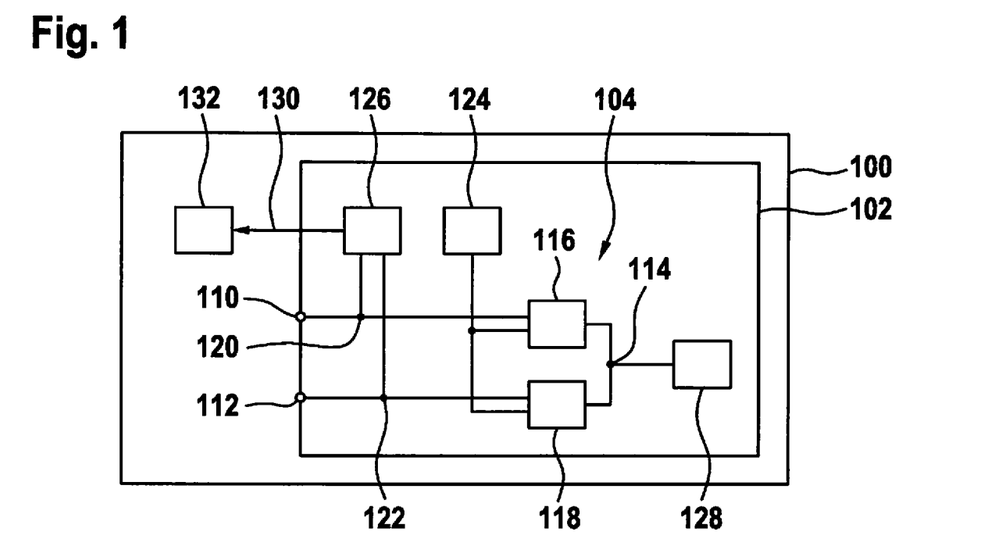
FIG. 1 shows a schematic illustration of a vehicle having a control unit with a device for supplying power according to one exemplary embodiment.

FIG. 1 shows a schematic illustration of a vehicle 100 having a control unit 102 with a device 104 for supplying power according to one exemplary embodiment. For example, the control unit 102 may be used to provide a function needed for a driving assistance function or needed to operate the vehicle 100.

The device 104 comprises a first connection 110 for a first power supply path, a second connection 112 for a second power supply path and a neutral point 114 for connecting the first power supply path and the second power supply path. According to this exemplary embodiment, the connections 110, 112 are in the form of interfaces for making electrical contact with the control unit 102. The neutral point 114 is arranged inside the control unit 102.

The device 104 also comprises a first switch 116 which is connected between the first connection 110 and the neutral point 114, and a second switch 118 which is connected between the second connection 112 and the neutral point 114.

A first measuring contact 120 is arranged here, by way of example, on a line connecting the first connection 110 to the first switch 116, and a second measuring contact 122 is arranged, by way of example, on a line connecting the second connection 112 to the second switch 118.

The device 104 also comprises a control device 124 and a monitoring device 126. The control device 124 and the monitoring device 126 may be in the form of separate units, may be combined in one unit or may be integrated, for example, in a circuit 128 for providing the function of the control unit 102.

The device 104 may assume a test state in which the power supply paths are checked. In response to or during the test state, the control device 124 is configured to keep one of the switches 116, 118 open and to keep the other of the switches 116, 118 closed.

The monitoring device 126 is configured to read in a first measured value via the first measuring contact 120 and to read in a second measured value via the second measuring contact 122 and to provide a monitoring signal 130 using the first measured value and the second measured value. According to one exemplary embodiment, the monitoring signal 130 indicates that there is a fault on one of the power supply paths if a discrepancy between the measured values is detected. According to one exemplary embodiment, the monitoring signal 130 is made available to a warning device 132 of the vehicle 100.

According to one exemplary embodiment, the voltage potential applied to the neutral point 114 is used to operate the circuit 128.

Figure 2:
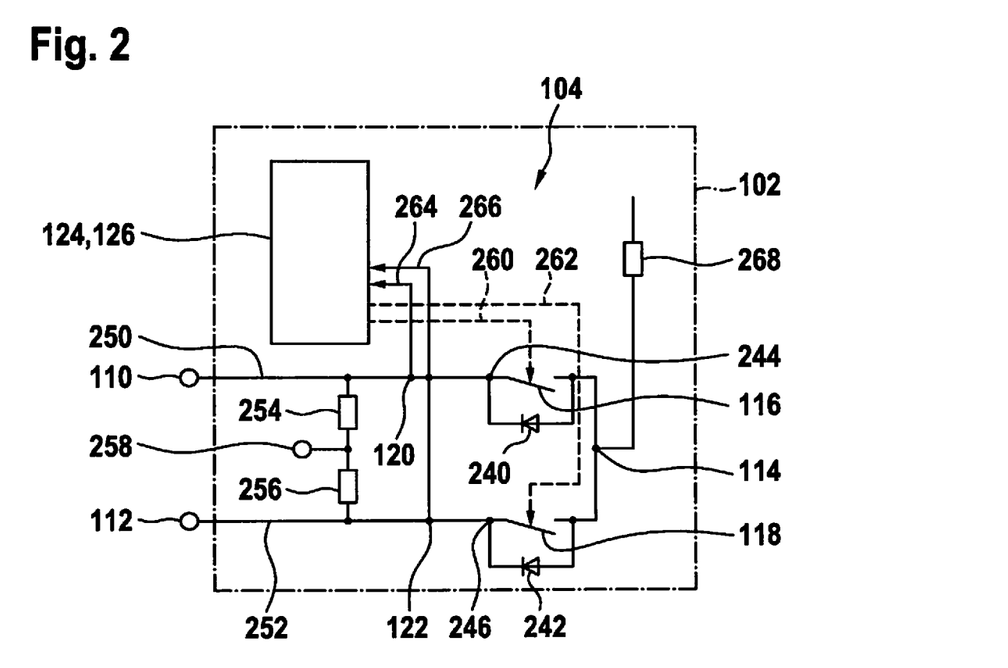
FIG. 2 shows a circuit diagram of a control unit with a device for supplying power according to one exemplary embodiment.

FIG. 2 shows a circuit diagram of a control unit 102 with a device 104 for supplying power according to one exemplary embodiment. This may be an exemplary embodiment of the control unit 102 described with reference to FIG. 1.

In addition to the features already described with reference to FIG. 1, the device 104 according to this exemplary embodiment comprises a diode 240 which is connected in parallel with the first switch 116 and a further diode 242 which is connected in parallel with the second switch 118. According to this exemplary embodiment, the anodes of the diodes 240, 242 are connected to the neutral point 114.

The first measuring contact 120 is arranged on a line 250 connecting the first connection 110 to a first contact 244 of the first switch 116 and the second measuring contact 122 is arranged on a line 252 connecting the second connection 112 to a first contact 246 of the second switch 118. According to this exemplary embodiment, the lines 250, 252 are connected via a series circuit comprising two resistors 254, 256. A third connection 258 is coupled to a line connecting the resistors 254, 256.

According to one exemplary embodiment, a voltage potential GND 1 is applied to the first connection 110, a voltage potential GND 2 is applied to the second connection 112 and a voltage potential VDD is applied to the third connection 258. During fault-free operation of the control unit 102, the voltage potentials GND 1, GND 2 are the same and differ from the voltage potential VDD. The resistors 254, 256 are therefore used as pull-up or pull-down resistors.

According to this exemplary embodiment, the control device 124 and the monitoring device 126 are combined in a microcontroller.

The control device 124 is configured to make a first control signal 260 available to a control input of the first switch 116 and to make a second control signal 262 available to a control input of the second switch 118. In the shown state of the device 104, the control signals 260, 262 are suitable for keeping the switches 116, 118 in an open position, for example on account of their instantaneous signal level.

The monitoring device 126 is configured to read in a first measured value 264 via the first measuring contact 120 and to read in a second measured value 266 via the second measuring contact 122. The first measured value 264 represents a voltage potential applied to the first line 250 and the second measured value 266 represents a voltage potential applied to the second line 252.

According to this exemplary embodiment, the neutral point 114 is connected to a resistor 268 which is also referred to as resistor RL.

According to one exemplary embodiment, the approach described here is used for polarity reversal protection for a redundant power supply in safety-critical systems.

In automotive engineering, in particular in safety-critical systems such as ABS/EBS/ESP/transmission actuators, increasing importance is being placed on a stable and reliable power supply in order to have these systems available as permanently as possible. For this reason, the requirement for a redundant power supply exists in these systems. The devices, for example according to the control unit 102 shown, each have two completely separate and autonomously conducted supply lines for the battery voltage (UB) and ground (GND), which supply lines are conducted, via the connections 110, 112, to the control unit 102, also referred to as the ECU. There, these two redundant lines can be combined at the neutral point 114 to form a common supply again, for example.

In order to be able to ensure the function of the redundant power supply, special monitoring of the individual supply lines is required. Faults in the supply lines, plug connections, fuses, etc. are intended to be able to be reliably detected and indicated, for example via the monitoring signal 130. In the event of a fault, a power supply path can then be disconnected, for example, in order to prevent a current from being permanently conducted through the control unit 102. In this case, the power supply is still fully functional via the remaining intact power supply path. This makes it possible to implement a quasi-redundant system with two separate supply lines which are combined in the control unit 102.

For this purpose, there are two redundant power supply paths, here GND power supply paths, the state of which can be diagnosed. In the event of a fault in which one power supply path is defective, it is possible to supply power to the entire unit 102 via the other power supply path which is still intact.

According to the approach described, there are, in principle, two independent power supply paths. During fully functional normal operation, both power supply paths are connected in parallel, with the result that the entire power consumption of the system is ideally uniformly divided among these two power supply paths.

The quality of a power supply path can be detected by cyclical alternate test pulses on the two power supply paths. In the event of a fault, the driver of the vehicle can be warned, for example using the warning device 132, and the system can be changed to the safe disconnected state. The two redundant power supply paths have switchable diodes 240, 242 and a positive/negative voltage measurement using the measured values 264, 266.

According to different exemplary embodiments, the described approach has a multiplicity of advantages. According to one exemplary embodiment, two independent power supply paths (redundancy) are provided for the negative (GND) branch. Testable and switchable polarity reversal protection diodes are used. An interruption in a GND power supply path is detected. Furthermore, it is possible to detect a short circuit with respect to the battery voltage and to disconnect this power supply path in order to prevent high currents from being permanently conducted through the control unit 102. It is possible to detect a short circuit between the internal and external ground potential GND. Furthermore, polarity reversal protection diodes which are otherwise necessary in circuit breakers are dispensed with. As a result of the defective GND input in the form of one of the connections 110, 112 being isolated from the internal ground potential which is applied to the neutral point 114, the control unit 102 still remains diagnosable and can communicate the fault state to other further systems in the vehicle. This ensures the functional reliability.

Figure 3:
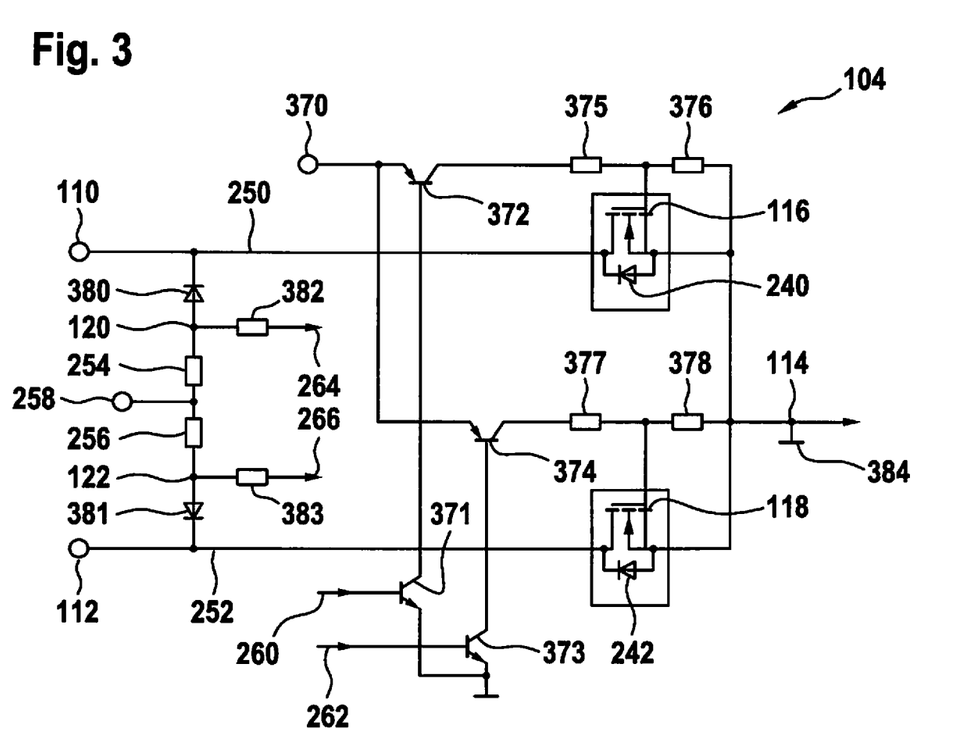
FIG. 3 shows a circuit diagram of a device for supplying power according to one exemplary embodiment.

FIG. 3 shows a circuit diagram of a device 104 for supplying power according to one exemplary embodiment. This may be an exemplary embodiment of the device described with reference to FIG. 2.

According to this exemplary embodiment, the first switch 116 and the diode 240 are implemented by a first transistor device and the second switch 118 and the further diode 242 are implemented by a second transistor device.

In order to control the switches 116, 118, the device 104 according to this exemplary embodiment comprises a fourth connection 370, a first transistor 371, a second transistor 372, a third transistor 373, a fourth transistor 374, a third resistor 375, a fourth resistor 376, a fifth resistor 377 and a sixth resistor 378. During operation of the device 104, a voltage potential VDD10 is applied to the fourth connection 370, which voltage potential differs, for example, from the voltage potential applied to the third connection 258, here VDD5 for example.

The first control signal 260 is made available to a control input of the first transistor 371 which is connected between a control input of the second transistor 372 and a ground connection. The second transistor 372 is connected between the fourth connection and a first contact of the third resistor 375. A second contact of the third resistor 375 is connected to a control connection of the first switch 116 and to a first contact of the fourth resistor 376. A second contact of the fourth resistor 376 is connected to the neutral point 114.

The second control signal 262 is made available to a control input of the third transistor 373 which is connected between a control input of the fourth transistor 374 and the ground connection. The third transistor 373 is connected between the fourth connection and a first contact of the fifth resistor 377. A second contact of the fifth resistor 377 is connected to a control connection of the second switch 118 and to a first contact of the sixth resistor 378. A second contact of the sixth resistor 378 is connected to the neutral point 114.

According to this exemplary embodiment, the third connection 258 is connected to the first line 250 via the first resistor 254 and a first diode 380. Accordingly, according to this exemplary embodiment, the third connection 258 is connected to the second line 252 via the second resistor 256 and a second diode 381.

According to this exemplary embodiment, the first measured value 264 is read in, via a seventh resistor 382, from the first measuring point 120 which is arranged on a connecting line connecting the first resistor 254 and the first diode 380. The second measured value 266 is accordingly read in, via an eighth resistor 383, from the second measuring point 122 which is arranged on a connecting line connecting the second resistor 256 and the second diode 381.

According to one exemplary embodiment, in the non-activated state of the circuit implementing the device 104, the two switches 116, 118, also referred to as main switches or GND switches, are not connected. As a result of their integrated diode 240, 242, which is implemented here as a body diode in the case of use of MOSFETs for the switches 116, 118, the two switches 116, 118 are conductive even in the disconnected state of the switches 116, 118.

The internal ground potential 384, also referred to as internal GND, which is applied to the neutral point 114 is always switched through in the case of correct polarity irrespective of whether or not the switches 116, 118 have actually been activated.

As soon as the power supply is connected in the case of correct polarity, the two switches 116, 118 are connected after checking the potentials GND1, GND2 applied to the connections 110, 112. This ensures that only a negligible potential offset caused by the two diodes 240, 242 is present between the internal ground potential 384 applied to the neutral point 114 and the two connections 110, 112. This results in a minimum voltage drop and a minimum power loss at the switches 116, 118 and at the respective diode 240, 242.

The microcontroller having the devices 124, 126 can individually connect and disconnect the two switches 116, 118 for test purposes. If one of the switches 116, 118 is disconnected and a significant potential difference is present on one of the two input paths at the connections 110, 112, that is to say if the voltages applied to the connections 110, 112 are different (for example as a result of a ground offset), a voltage difference arises at the pull-up resistors 254, 256 and the diodes 380, 381, also referred to as feedback protection diodes, and can be detected by the microcontroller via the two measuring points 120, 122 which are also referred to as feedback inputs. A possible fault can therefore be indicated to the driver.

The feedback from the two GNDs applied to the connections 110, 112 can also be effected in such a manner that both negative voltages and positive voltages can be measured at the connections 110, 112. It is therefore possible to detect a short circuit with respect to the battery voltage, an interruption and a short circuit between the internal ground potential 384 and external ground potentials applied to the connections 110, 112.

Figure 4:
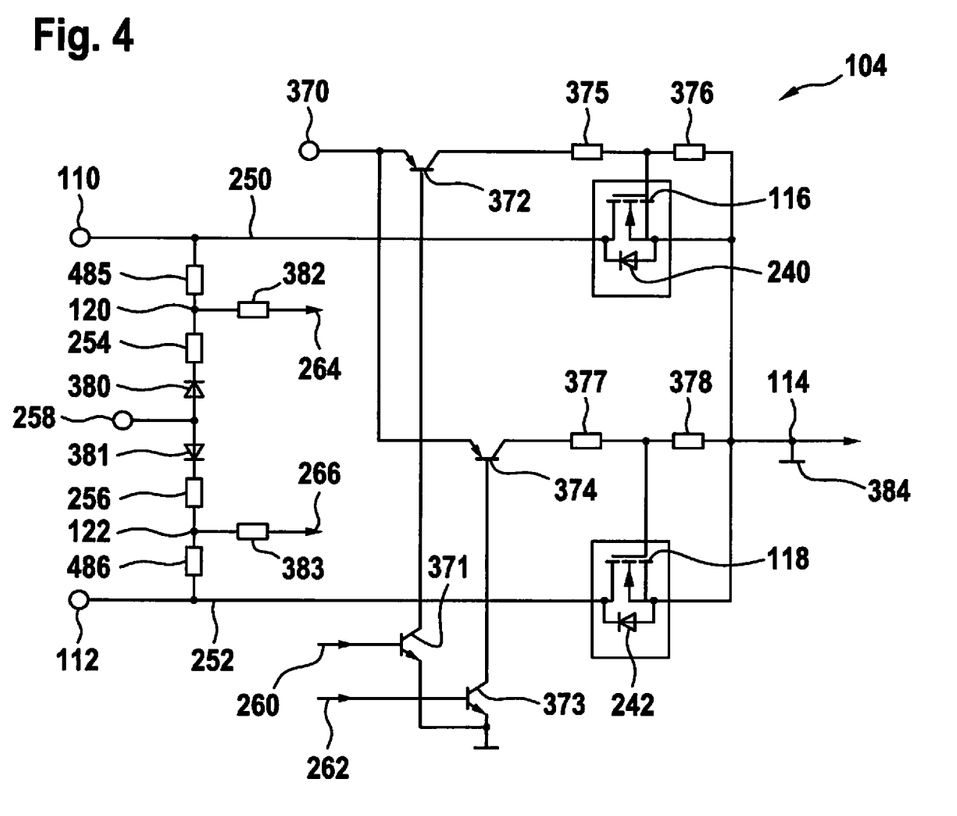
FIG. 4 shows a circuit diagram of a device for supplying power according to one exemplary embodiment.

FIG. 4 shows a circuit diagram of a device 104 for supplying power according to one exemplary embodiment. This may be an exemplary embodiment of the device described with reference to FIG. 2. The device 104 shown in FIG. 4 corresponds to the device shown in FIG. 3, with the difference that the third connection 258 and the measuring points 120, 122 are connected differently.

According to this exemplary embodiment, the third connection 258 is connected to the first line 250 via the first diode 380, the first resistor 254 and a ninth resistor 485. The first measured value 264 is read in, via the seventh resistor 382, from the first measuring point 120 which is arranged on a line connecting the first resistor 254 and the ninth resistor 485.

Accordingly, the third connection 258 is connected to the second line 252 via the second diode 381, the second resistor 256 and a tenth resistor 486. The second measured value 266 is read in, via the eighth resistor 383, from the second measuring point 122 which is arranged on a line connecting the second resistor 256 and the tenth resistor 486.

Figure 5:
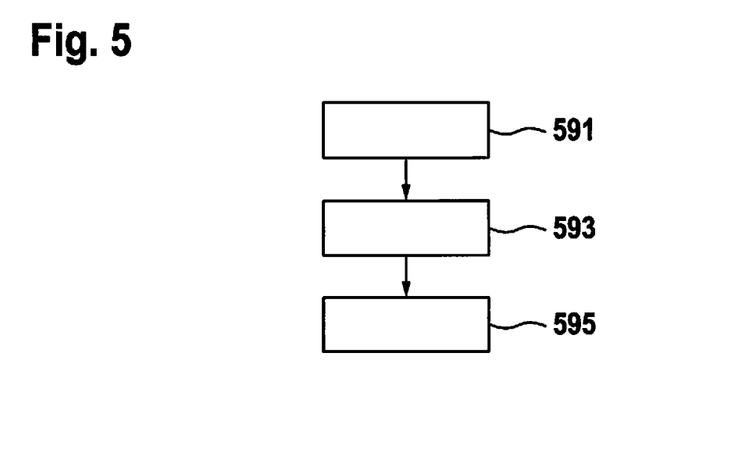
FIG. 5 shows a flowchart of a method for supplying power according to one exemplary embodiment.

FIG. 5 shows a flowchart of a method for supplying power according to one exemplary embodiment. The method can be carried out, for example, in connection with a device for supplying power described with reference to the preceding figures.

In a step 591, at least one control signal is made available to an interface to the switches in order to keep one of the switches open and the other of the switches closed. In a step 593, a first measured value and a second measured value are read in. In a step 595, a monitoring signal is provided using the measured values.

Step 591 can be carried out by the control device described above, for example, and steps 593, 595 can be carried out by the monitoring device described above.

Steps 591, 593, 595 can be carried out repeatedly, in which case, in step 591, the at least one control signal is alternately provided such that, in alternation, the first switch is closed and the second switch is open in a first phase and the first switch is open and the second switch is closed in a second phase.

Steps 591, 593, 595 can be carried out during a test state of the device. Upon activation of the device, step 591 can be carried out alone, in which case the at least one control signal is provided such that both switches are closed. If the device is deactivated, step 591 can be carried out alone, in which case the at least one control signal is provided such that both switches are opened.

According to one exemplary embodiment, the test state is carried out repeatedly several times after activation of the device, for example at predefined intervals of time.

If an exemplary embodiment comprises an "and/or" conjunction between a first feature and a second feature, this should be read such that the exemplary embodiment has both the first feature and the second feature according to one embodiment and has either only the first feature or only the second feature according to a further embodiment.

THE LIST OF REFERENCE SIGNS IS AS FOLLOWS

100 Vehicle
102 Control unit
104 Device
110 First connection
112 Second connection
114 Neutral point
116 First switch
118 Second switch
120 First measuring point
122 Second measuring point
124 Control device
126 Monitoring device 128 Circuit
130 Monitoring signal
132 Warning device
240 Diode (body diode)
242 Further diode (body diode)
244 First contact of the first switch
246 First contact of the second switch
250 First line
252 Second line
254 First resistor
256 Second resistor
258 Third connection
260 First control signal
262 Second control signal
264 First measured value
266 Second measured value
268 Resistor
370 Fourth connection
371 Transistor
372 Transistor
373 Transistor
374 Transistor
375 Resistor
376 Resistor
377 Resistor
378 Resistor
380 First diode
381 Second diode
382 Resistor
383 Resistor
384 Internal ground potential
485 Resistor
486 Resistor
591 Providing step
593 Reading-in step
595 Providing step

The invention claimed is:

1. A device for supplying power to a control unit for a vehicle, comprising:
   a first connection for a first power supply path, a second connection for a second power supply path and a neutral point for connecting the first power supply path and the second power supply path;
   a first switch having a first contact and a second contact, wherein the first contact is connected to the first connection and the second contact is connected to the neutral point, and a second switch having a first contact and a second contact, wherein the first contact is connected to the second connection and the second contact is connected to the neutral point;
   a first measuring contact for capturing a first measured value representing a voltage potential of the first power supply path, and a second measuring contact for capturing a second measured value representing a voltage potential of the second power supply path;
   a control device to keep one of the switches open and to keep the other of the switches closed in response to a test state of the device;
   a monitoring device to provide a monitoring signal using the first measured value and the second measured value if the device is in the test state;
   a diode which is connected in parallel with the first switch between the first connection and the neutral point; and
   a further diode which is connected in parallel with the second switch between the second connection and the neutral point.

2. The device of claim 1, wherein the control device is configured to keep the first switch open and the second switch closed during a first phase of the test state and to keep the first switch closed and the second switch open during a second phase of the test state.

3. The device of claim 1, wherein the neutral point represents a ground connection for an electrical circuit of the control unit.

4. The device of claim 1, wherein the first measuring contact is arranged on a first connecting line between the first connection and the first contact of the first switch, and wherein the second measuring contact is arranged on a second connecting line between the second connection and the first contact of the second switch.

5. A device for supplying power to a control unit for a vehicle, comprising:
   a first connection for a first power supply path, a second connection for a second power supply path and a neutral point for connecting the first power supply path and the second power supply path;
   a first switch having a first contact and a second contact, wherein the first contact is connected to the first connection and the second contact is connected to the neutral point, and a second switch having a first contact and a second contact, wherein the first contact is connected to the second connection and the second contact is connected to the neutral point;
   a first measuring contact for capturing a first measured value representing a voltage potential of the first power supply path, and a second measuring contact for capturing a second measured value representing a voltage potential of the second power supply path;
   a control device to keep one of the switches open and to keep the other of the switches closed in response to a test state of the device; and
   a monitoring device to provide a monitoring signal using the first measured value and the second measured value if the device is in the test state;
   wherein the control device is configured to close the switches in response to activation of the device, and/or wherein the control device is configured to open the switches in response to deactivation of the device.

6. A device for supplying power to a control unit for a vehicle, comprising:
   a first connection for a first power supply path, a second connection for a second power supply path and a neutral point for connecting the first power supply path and the second power supply path;
   a first switch having a first contact and a second contact, wherein the first contact is connected to the first connection and the second contact is connected to the neutral point, and a second switch having a first contact and a second contact, wherein the first contact is connected to the second connection and the second contact is connected to the neutral point;
   a first measuring contact for capturing a first measured value representing a voltage potential of the first power supply path, and a second measuring contact for capturing a second measured value representing a voltage potential of the second power supply path;
   a control device to keep one of the switches open and to keep the other of the switches closed in response to a test state of the device; and
   a monitoring device to provide a monitoring signal using the first measured value and the second measured value if the device is in the test state;

wherein the monitoring device is configured to compare the first measured value and the second measured value with one another to determine a discrepancy between the voltage potentials of the power supply paths, and wherein the monitoring signal indicates the discrepancy.

7. A device for supplying power to a control unit for a vehicle, comprising:
  a first connection for a first power supply path, a second connection for a second power supply path and a neutral point for connecting the first power supply path and the second power supply path;
  a first switch having a first contact and a second contact, wherein the first contact is connected to the first connection and the second contact is connected to the neutral point, and a second switch having a first contact and a second contact, wherein the first contact is connected to the second connection and the second contact is connected to the neutral point;
  a first measuring contact for capturing a first measured value representing a voltage potential of the first power supply path, and a second measuring contact for capturing a second measured value representing a voltage potential of the second power supply path;
  a control device to keep one of the switches open and to keep the other of the switches closed in response to a test state of the device;
  a monitoring device to provide a monitoring signal using the first measured value and the second measured value if the device is in the test state; and
  a third connection for providing a voltage potential, a first spur line which includes at least one first resistor and a first diode and connects the third connection to the first connection, and a second spur line which includes at least one second resistor and a second diode and connects the third connection to the second connection, wherein the first measuring contact is on the first spur line and the second measuring contact is on the second spur line.

8. A control unit for a vehicle, comprising:
  a device for supplying power to a control unit for a vehicle, including:
    a first connection for a first power supply path, a second connection for a second power supply path and a neutral point for connecting the first power supply path and the second power supply path;
    a first switch having a first contact and a second contact, wherein the first contact is connected to the first connection and the second contact is connected to the neutral point, and a second switch having a first contact and a second contact, wherein the first contact is connected to the second connection and the second contact is connected to the neutral point;
    a first measuring contact for capturing a first measured value representing a voltage potential of the first power supply path, and a second measuring contact for capturing a second measured value representing a voltage potential of the second power supply path;
    a control device to keep one of the switches open and to keep the other of the switches closed in response to a test state of the device;
    a monitoring device to provide a monitoring signal using the first measured value and the second measured value if the device is in the test state;
    a diode which is connected in parallel with the first switch between the first connection and the neutral point; and
    a further diode which is connected in parallel with the second switch between the second connection and the neutral point.

9. A method for monitoring a power supply for a control unit for a vehicle, the method comprising:
  making at least one control signal available to an interface to switches to keep one of the switches open and other ones of the switches closed, wherein the switches include a first switch and a second switch, and wherein the power is supplied using a first connection for a first power supply path, a second connection for a second power supply path and a neutral point for connecting the first power supply path and the second power supply path, and the first switch having a first contact and a second contact, wherein the first contact is connected to the first connection and the second contact is connected to the neutral point, and the second switch having a first contact and a second contact, wherein the first contact is connected to the second connection and the second contact is connected to the neutral point, and a first measuring contact for capturing a first measured value representing a voltage potential of the first power supply path and a second measuring contact for capturing a second measured value representing a voltage potential of the second power supply path;
  reading in the first measured value and the second measured value; and
  providing a monitoring signal using the measured values;
  wherein a diode is connected in parallel with the first switch between the first connection and the neutral point, and
  wherein a further diode is connected in parallel with the second switch between the second connection and the neutral point.

* * * * *